United States Patent
Zhang et al.

(10) Patent No.: US 9,222,968 B2
(45) Date of Patent: Dec. 29, 2015

(54) MONITORING SYSTEM FOR DETECTING DEGRADATION OF INTEGRATED CIRCUIT

(71) Applicants: Zhichen Zhang, Beijing (CN); Chuanzheng Wang, Beijing (CN); Qilin Zhang, Beijing (CN)

(72) Inventors: Zhichen Zhang, Beijing (CN); Chuanzheng Wang, Beijing (CN); Qilin Zhang, Beijing (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 284 days.

(21) Appl. No.: 14/076,286

(22) Filed: Nov. 11, 2013

(65) Prior Publication Data
US 2014/0191777 A1    Jul. 10, 2014

(30) Foreign Application Priority Data

Jan. 9, 2013  (CN) .......................... 2013 1 0006802

(51) Int. Cl.
G01R 31/02 (2006.01)
G01R 31/28 (2006.01)
G01R 31/27 (2006.01)

(52) U.S. Cl.
CPC ........ G01R 31/2856 (2013.01); G01R 31/2849 (2013.01); *G01R 31/275* (2013.01)

(58) Field of Classification Search
CPC ............. G01R 31/2856; G01R 31/275; G01R 31/3004; G01R 31/2849; G01R 31/3181
USPC .......................... 324/762.01–762.03, 762.05; 438/17–18; 257/48
See application file for complete search history.

(56) References Cited

U.S. PATENT DOCUMENTS

| | | | | |
|---|---|---|---|---|
| 4,327,332 A * | 4/1982 | Malchow | ................ | H03F 3/195 330/261 |
| 5,625,288 A * | 4/1997 | Snyder | ............... | G01R 31/2858 324/73.1 |
| 5,905,855 A * | 5/1999 | Klaiber | ............... | G06F 11/3688 714/31 |
| 6,587,994 B1 * | 7/2003 | Yamaji | ................ | G06F 17/5036 703/18 |
| 6,603,328 B2 * | 8/2003 | Takahashi | .......... | G01R 31/3008 324/762.02 |
| 6,731,179 B2 * | 5/2004 | Abadeer | ................ | H03K 5/133 324/750.3 |
| 7,026,838 B2 * | 4/2006 | Reddy | ................ | G01R 31/2884 324/762.08 |
| 7,271,608 B1 * | 9/2007 | Vermeire | ........... | G01R 31/2856 324/750.3 |
| 7,338,817 B2 * | 3/2008 | Liu | ..................... | G01R 31/2642 438/10 |
| 7,400,162 B2 * | 7/2008 | Gattiker | ............. | G01R 31/2856 324/762.01 |
| 7,486,098 B2 * | 2/2009 | Gattiker | ............. | G01R 31/2879 324/762.01 |
| 7,504,847 B2 * | 3/2009 | Goodnow | .......... | G01R 31/2856 324/762.01 |

(Continued)

OTHER PUBLICATIONS

Satoh, Shingo., Improvement of Degradation Detection in ESD test for Semiconductor Products, ITES Co, Ltd., IEEE 2002.*

(Continued)

*Primary Examiner* — Patrick Assouad
*Assistant Examiner* — Sean Curtis
(74) *Attorney, Agent, or Firm* — Charles Bergere

(57) ABSTRACT

A monitoring system for detecting stress degradation of a semiconductor integrated circuit has an amplifier circuit and degradation test transistors. Multiplexers are provided that have an output coupled to a respective electrode of the degradation test transistor. Each of the multiplexers has an input coupled to one of the monitor nodes and a respective node of the amplifier circuit. In operation, the multiplexers selectively insert the degradation test transistor into either the integrated circuit or the amplifier circuit so that when inserted into the integrated circuit the degradation test transistor is subjected to stress degradation voltages in the integrated circuit. When the degradation test transistor is inserted into the amplifier circuit, an output signal is generated that is indicative of stress degradation of the integrated circuit.

16 Claims, 8 Drawing Sheets

(56) References Cited

U.S. PATENT DOCUMENTS

| | | | | |
|---|---|---|---|---|
| 7,564,256 B2* | 7/2009 | Gattiker | G01R 31/31858 | 324/762.02 |
| 7,759,960 B2* | 7/2010 | Gattiker | G01R 31/2856 | 324/750.05 |
| 7,974,595 B2* | 7/2011 | Reddy | G01R 31/2879 | 370/279 |
| 8,081,003 B2* | 12/2011 | Pacha | G01R 31/3181 | 324/537 |
| 8,248,095 B2* | 8/2012 | Noorlag | G11C 5/02 | 324/522 |
| 8,693,271 B2* | 4/2014 | Raval | G11C 29/06 | 365/154 |
| 2006/0145751 A1* | 7/2006 | Gangasani | G05F 3/262 | 327/543 |
| 2012/0096323 A1* | 4/2012 | Tachibana | G11C 29/50 | 714/719 |
| 2012/0161885 A1* | 6/2012 | Saneyoshi | G01R 31/2856 | 331/55 |
| 2012/0259575 A1* | 10/2012 | Graas | G06F 19/00 | 702/120 |
| 2013/0188795 A1* | 7/2013 | Quan | H04R 29/00 | 381/58 |
| 2013/0221987 A1* | 8/2013 | Cranford, Jr. | G11C 29/50 | 324/613 |

OTHER PUBLICATIONS

Kim et al., Impact Analysis of NBTI/PBTI on SRAM Vmin and Design Techniques for Improved SRAM Vmin, Journal of Semiconductor Technology and Science, vol. 13, No. 2, Apr. 2013.*

Banyamin and Berwick, The Gain Advantages of Four Cascaded Single Stage Distributed Amplifier Configurations, Dept of Electronic and Computing Engineering, Brunel University, IEEE MTT-S Digest, 2000.*

Raffo et al., An Automated Measurement System for the Characterization of Electron Device Degradation Under Nonlinear Dynamic Regime, IEEE Transactions on Instrumentation and Measurement, vol. 58, No. 8, Aug. 2009.*

Satoh, Shingo., Improvementof Degradation Detection in ESD testfor Semiconductor Products, ITES Co, Ltd., IEEE 2002.*

Kim et al., ImpactAnalysis of NBTI/PBTI on SRAM Vmin and Design Techniques for Improved SRAM Vmin, Journal of Semiconductor Technology And Science, vol. 13, No. 2, Apr. 2013.*

Banyamin and Berwick, The Gain Advantages of Four Cascaded Single Stage Distributed Amplifier Configurations, Deptof Electronic and Computing Engineering, Brunel University, IEEE MTT-S Digest, 2000.*

Atma-Sphere Music Systems, Inc., Understanding Our Basic Circuits, Copyright2010.*

* cited by examiner

400

MONITORING SYSTEM FOR DETECTING DEGRADATION OF INTEGRATED CIRCUIT

BACKGROUND OF THE INVENTION

The present invention relates to integrated circuits and, more particularly, to a monitoring system for detecting degradation of a semiconductor integrated circuit.

Semiconductor devices are being manufactured with an increased functionality to package pin count (external terminal or I/O count). This is partly because of improved silicon die fabrication techniques that allow die size reductions and thus a semiconductor die can be assembled into a relatively small package. Such improved silicon die fabrication techniques result in deep sub-micron semiconductor circuits comprising numerous transistors such as Field Effect Transistors (FETs).

When voltages are applied across the gate and source or drain and source electrodes of a FET, electric charges are created and stored in the FET. These charges are proportional to the voltages applied and if these voltages are sufficiently large, and are applied frequently enough or for relatively long durations, the intrinsic characteristics of the FET can be modified. Such intrinsic characteristics include Time Dependent Dielectric Breakdown (TDDB), Hot Carrier Injection (HCI), Negative Bias Instability (NBI) and threshold voltage breakdown. When there is an unacceptable alteration in a FET's performance due to changes in the intrinsic characteristics, a circuit that includes the FET is considered stressed or degraded. Such stressed or degraded circuits are typically replaced or reconfigured, however such stressed or degraded circuits may remain undetected and if they continue to operate within a system, the performance and accuracy of the system may be compromised.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
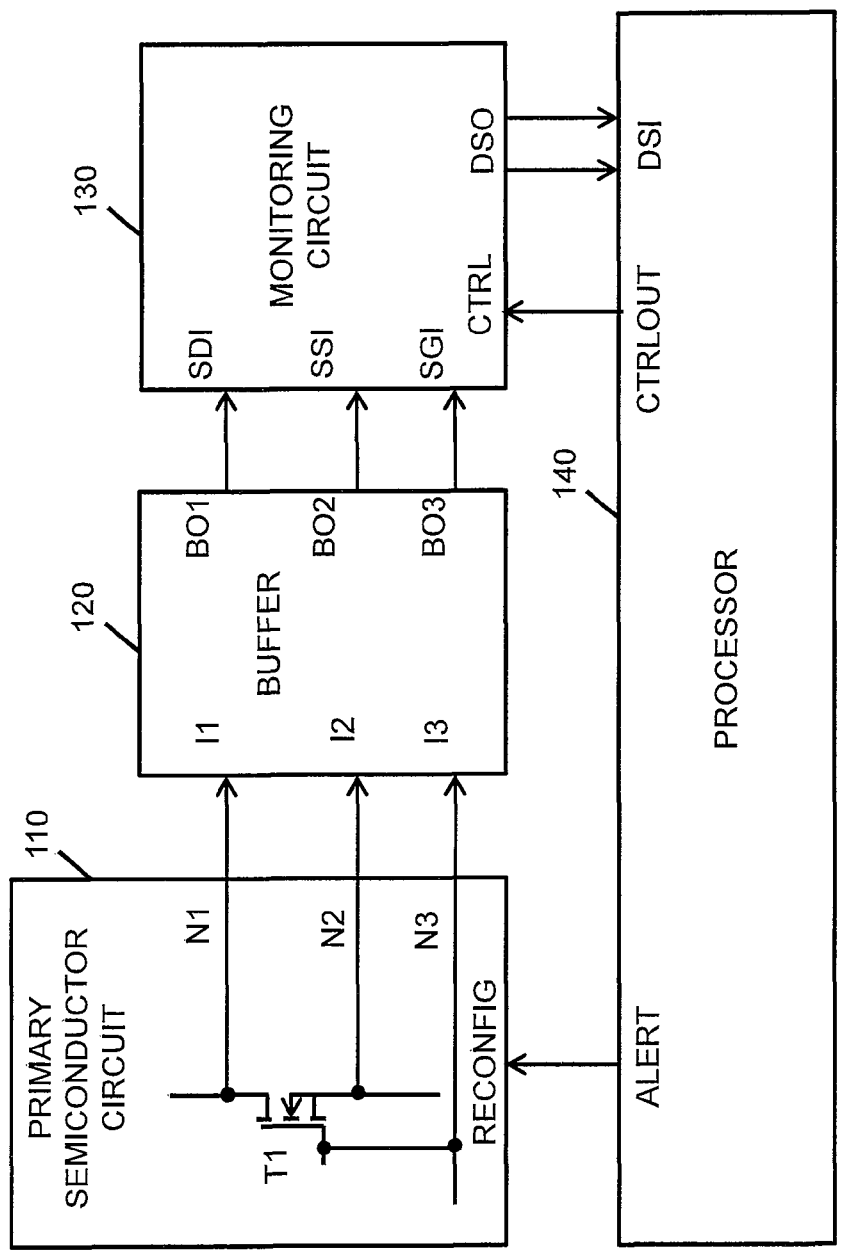
FIG. 1 is a schematic block diagram of a system for detecting stress degradation of an integrated circuit in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element proceeded by "comprises . . . a" does not, without more constraints, preclude the existence of additional identical elements that comprises the element.

In one embodiment, the present invention provides a system for detecting stress degradation of a semiconductor circuit. The system comprises a primary semiconductor circuit that has a plurality of monitor nodes. There is an amplifier circuit with at least one amplifier output terminal and at least one degradation test transistor. There is also a plurality of multiplexers each having an output coupled to a respective electrode of the degradation test transistor. Each of the multiplexers has an input coupled to one of the monitor nodes and a respective node of the amplifier circuit. In operation, the multiplexers selectively insert the degradation test transistor into either the primary semiconductor circuit or the amplifier circuit so that when inserted into the primary semiconductor circuit the degradation test transistor is subjected to stress degradation voltages in the primary semiconductor circuit. When the degradation test transistor inserted into the amplifier circuit an output signal at the output terminal is indicative of stress degradation of the primary semiconductor circuit.

In another embodiment the present invention provides for a method for monitoring stress degradation of a semiconductor circuit, the method being controlled by a processor and the method includes inserting at least one degradation test transistor into a primary semiconductor circuit to thereby subject the degradation test transistor to stress degradation voltages. The method performs removing the degradation test transistor from the primary semiconductor circuit and inserting the degradation test transistor into an amplifier circuit. There is also performed a process of analyzing an output signal at an output terminal of the amplifier circuit to determine if the degradation test transistor is degraded. There is provided a warning signal indicative of the primary semiconductor circuit being degraded in response to the analyzing determining that the degradation test transistor is degraded.

Referring to FIG. 1, a block diagram of a system 100 for detecting stress degradation of a semiconductor circuit in accordance with a preferred embodiment of the present invention is shown. The system 100 includes a primary semiconductor circuit 110 that three monitor nodes that are a drain electrode N1, source electrode N2 and gate electrode N3 of a transistor T1. The system 100 includes a buffer module 120 that couples the drain electrode N1, source electrode N2 and gate electrode N3 to a monitoring circuit 130. More specifically, the a buffer module 120 has inputs I1, I2, I3 coupled respectively to the drain electrode N1, source electrode N2 and gate electrode N3 and outputs B01, B02, B03 are coupled respectively to inputs SDI, SSI and SGI of the monitoring circuit 130.

The system 100 also includes a processor 140 with a control signal output node CTRLOUT coupled to a control input node CTRL of the monitoring circuit 130, a stress alert output node ALERT coupled to a reconfiguration node RECONFIG of the primary semiconductor circuit 110 and a degradation signal input node(s) DSI coupled to degradation signal output nodes DSO of the monitoring circuit 130. It should be noted that although two degradation signal output nodes DSO are illustrated, in other embodiments one degradation signal output node DSO can be used and any signal therefrom may be referenced, for instance, relative to ground GND or any other reference potential. Also, although the transistor T1 is shown as an N-Channel transistor, the transistor T1 may not necessarily be an N-Channel transistor and could be a P-channel transistor as will be apparent to a person skilled in the art.

Figure 2:
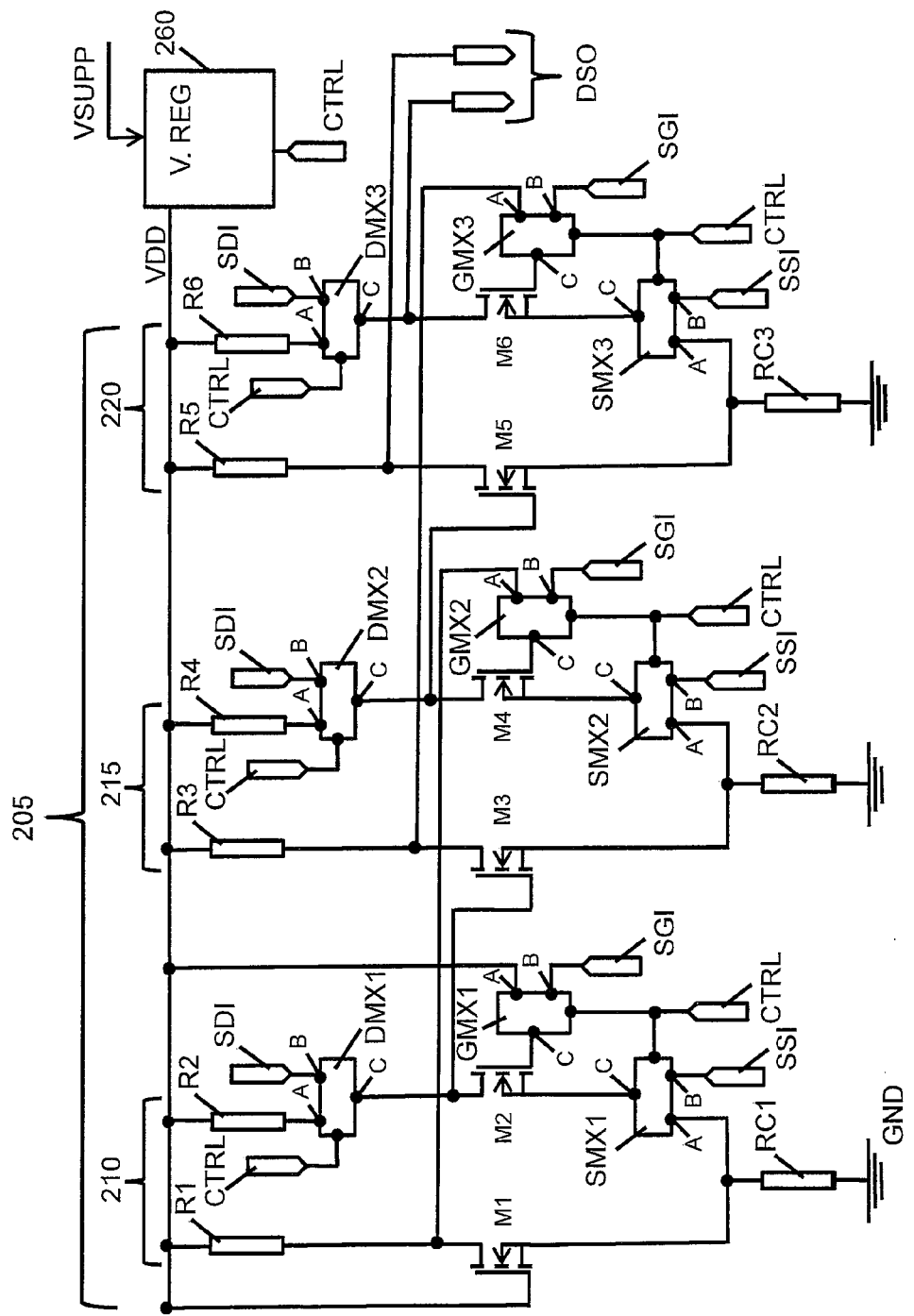
FIG. 2 is a schematic circuit diagram of a configurable amplifier circuit according to a first preferred embodiment of a monitoring circuit forming part of the system of FIG. 1.

Referring to FIG. 2 there is illustrated a circuit diagram of a configurable amplifier circuit 200 according to a first preferred embodiment of the monitoring circuit 130. The configurable amplifier circuit 200 includes a cascaded amplifier circuit 205 comprising a differential amplifier circuit 210, cascaded with a differential amplifier circuit 215 that is cascaded with a differential amplifier circuit 220. The cascaded amplifier circuit 205 has amplifier output terminals in the form of the degradation signal output nodes DSO and in this embodiment the cascaded amplifier circuit 205 is implemented with N-Channel transistors M1 to M6.

The configurable amplifier circuit 200 has a degradation test transistor M2 and resistor R2 coupled to a power supply line VDD to form a first branch of the differential amplifier circuit 210. There is also a reference transistor M1 and resistor R1 coupled to the power supply line VDD that forms a second branch of the differential amplifier circuit 210. Both the first branch and second branch have an associated common resistor RC1 connected to a ground GND terminal. A gate electrode of the reference transistor M1 is coupled to the power supply line VDD, whereas a gate electrode of the degradation test transistor M2 is selectively coupled to the supply line via a gate multiplexer GMX1. A source electrode of the reference transistor M1 is coupled to the common resistor RC1 and a source electrode of the degradation test transistor M2 is selectively coupled to the common resistor RC1 via a source multiplexer SMX1. Also, a drain electrode of the reference transistor M1 is coupled to the resistor R1 and drain electrode of the degradation test transistor M2 is selectively coupled to the resistor R2 via a drain multiplexer DMX1.

The configurable amplifier circuit 200 also has a degradation test transistor M4 and resistor R4 that is coupled to the power supply line VDD to form a first branch of the differential amplifier circuit 215. There is also a reference transistor M3 and resistor R3 coupled to the power supply line VDD that forms a second branch of the differential amplifier circuit 215. Both the first branch and second branch of the differential amplifier circuit 215 have an associated common resistor RC2 connected to the ground GND terminal. A gate electrode of the reference transistor M3 is coupled to the drain electrode of the degradation test transistor M2, whereas a gate electrode of the degradation test transistor M4 is selectively coupled to the drain electrode of the reference transistor M1 via a gate multiplexer GMX2. A source electrode of the reference transistor M3 is coupled to the common resistor RC2 and a source electrode of the degradation test transistor M4 is selectively coupled to the common resistor RC2 via a source multiplexer SMX2. Also, a drain electrode of the reference transistor M3 is coupled to the resistor R3 and drain electrode of the degradation test transistor M4 is selectively coupled to the resistor R4 via a drain multiplexer DMX2.

The configurable amplifier circuit 200 further includes a degradation test transistor M6 and resistor R6 that is coupled to the power supply line VDD to form a first branch of the differential amplifier circuit 220. There is also a reference transistor M5 and resistor R5 coupled to the power supply line VDD that forms a second branch of the differential amplifier circuit 220. Both the first branch and second branch of the differential amplifier circuit 220 have an associated common resistor RC3 connected to the ground GND terminal. A gate electrode of the reference transistor M5 is coupled to the drain electrode of the degradation test transistor M4, whereas a gate electrode of the degradation test transistor M6 is selectively coupled the drain electrode of the reference transistor M3 via a gate multiplexer GMX3. A source electrode of the reference transistor M5 is coupled to the common resistor RC3 and a source electrode of the degradation test transistor M6 is selectively coupled to the common resistor RC3 via a source multiplexer SMX3. Also, a drain electrode of the reference transistor M5 is coupled to the resistor R5 and drain electrode of the degradation test transistor M6 is selectively coupled to the resistor R6 via a drain multiplexer DMX3.

The differential amplifier circuit 210 has two output nodes one of which is the drain electrode of the degradation test transistor M2 which is coupled to the gate electrode of the reference transistor M3 and the other output node is the drain electrode of the reference transistor M1 which is coupled to an input A of the gate multiplexer GMX2. Similarly, the differential amplifier circuit 215 has two output nodes one of which is the drain electrode of the degradation test transistor M4 which is coupled to the gate electrode of the reference transistor M5 and the other output node is the drain electrode of the reference transistor M3 which is coupled to an input A of the gate multiplexer GMX3. Furthermore, the differential amplifier circuit 220 has output nodes providing the degradation signal output nodes DSO that are the drain electrodes of the reference transistor M5 and degradation test transistor M6.

The gate electrode of the degradation test transistor M2 is coupled to an output C of the gate multiplexer GMX1 and an input A of the gate multiplexer GMX1 is coupled to the power supply line VDD. Also, the gate electrodes of the degradation test transistors M4, M6 are respectively coupled to an output C of the gate multiplexers GMX2, GMX3, and inputs B of the gate multiplexers GMX1, GMX2, GMX3 are coupled to input SGI.

The drain electrodes of the degradation test transistors M2, M4, M6 are coupled to a respective output C of the drain multiplexers DMX1, DMX2, DMX3. Resistors R2, R4 and R6 are coupled to respective inputs A of the drain multiplexers DMX1, DMX2, DMX3 and inputs B of the drain multiplexers DMX1, DMX2, DMX3 are coupled to input SDI.

The source electrodes of the degradation test transistors M2, M4, M6 are coupled to a respective output C of the source multiplexers SMX1, SMX2, SMX3. The common resistors RC1, RC2, RC3 are coupled to respective inputs A of the source multiplexers SMX1, SMX2, SMX3 and inputs B of the source multiplexers SMX1, SMX2, SMX3 are coupled to input SSI. In addition, a control input of all the multiplexers SMX1, SMX2, SMX3, DMX1, DMX2, DMX3, GMX1, GMX2, GMX3 are coupled to the control input node CTRL.

The configurable amplifier circuit 200 also includes a voltage regulator 260 with an input power line VSUPP. The voltage regulator 260 has a control input that is coupled to the control input node CTRL and in operation the voltage regulator 260 controls a potential difference across the power supply line VDD and ground GND.

Figure 3:
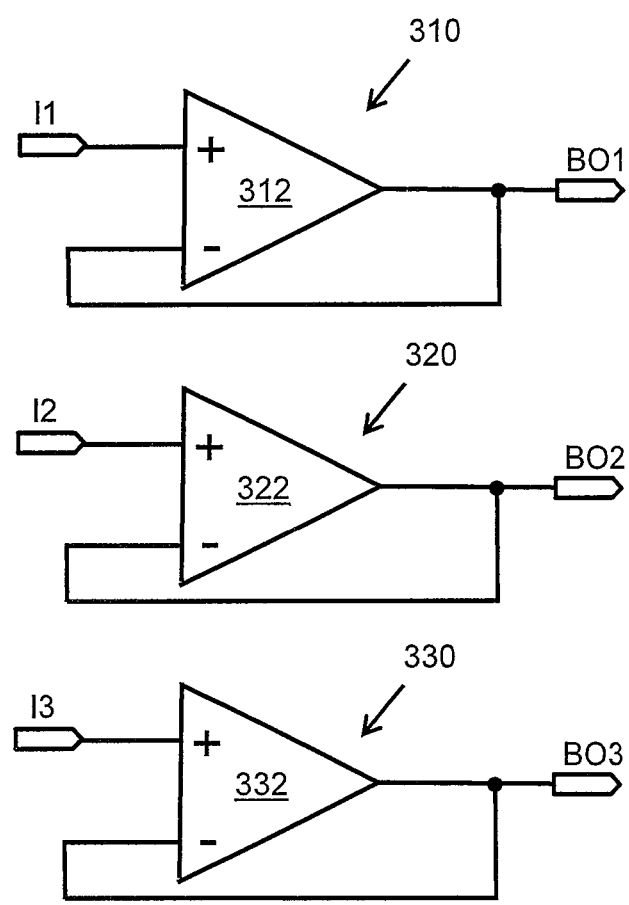
FIG. 3 is a schematic circuit diagram of a buffer module according to a preferred embodiment of the present invention and forming part of the system of FIG. 1.

Referring to FIG. 3, a circuit diagram of the buffer module 120 according to a preferred embodiment of the present invention is shown. The buffer module 120 includes three unity gain buffers 310, 320, 330. Unity gain buffer 310 includes an operation amplifier 312 with a non-inverting input coupled to input I1, and an amplifier output coupled to both a non-inverting input and output B01. The unity gain buffer 320 includes an operation amplifier 322 with a non-inverting input coupled to input I2, and an amplifier output coupled to both a non-inverting input and output B02. Similarly, the unity gain buffer 330 includes an operation amplifier 332 with a non-inverting input coupled to input I3, and an amplifier output coupled to both a non-inverting input and output B03.

Figure 4:
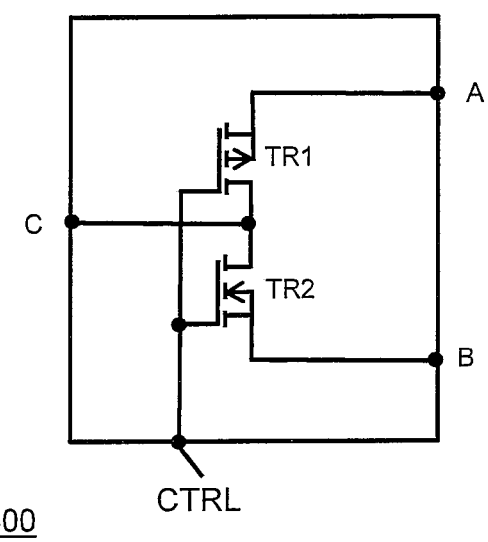
FIG. 4 is a schematic circuit diagram of a multiplexer according to a preferred embodiment of the present invention and forming part of the circuit of FIG. 2.

FIG. 4 illustrates a circuit diagram of a multiplexer 400 used to implement the multiplexers SMX1, SMX2, SMX3, DMX1, DMX2, DMX3, GMX1, GMX2, GMX3 in accordance with a preferred embodiment of the present invention. The multiplexer 400 includes series coupled complementary transistors TR1 and TR2 with their gate electrodes coupled to the control input node CTRL. Transistor TR1 is a P-channel transistor with a source electrode coupled to input A and transistor TR2 is an N-channel transistor with a source electrode coupled to input B. The Drain electrodes of both transistors TR1 and Tr2 are coupled together and are coupled to output C.

Figure 5:
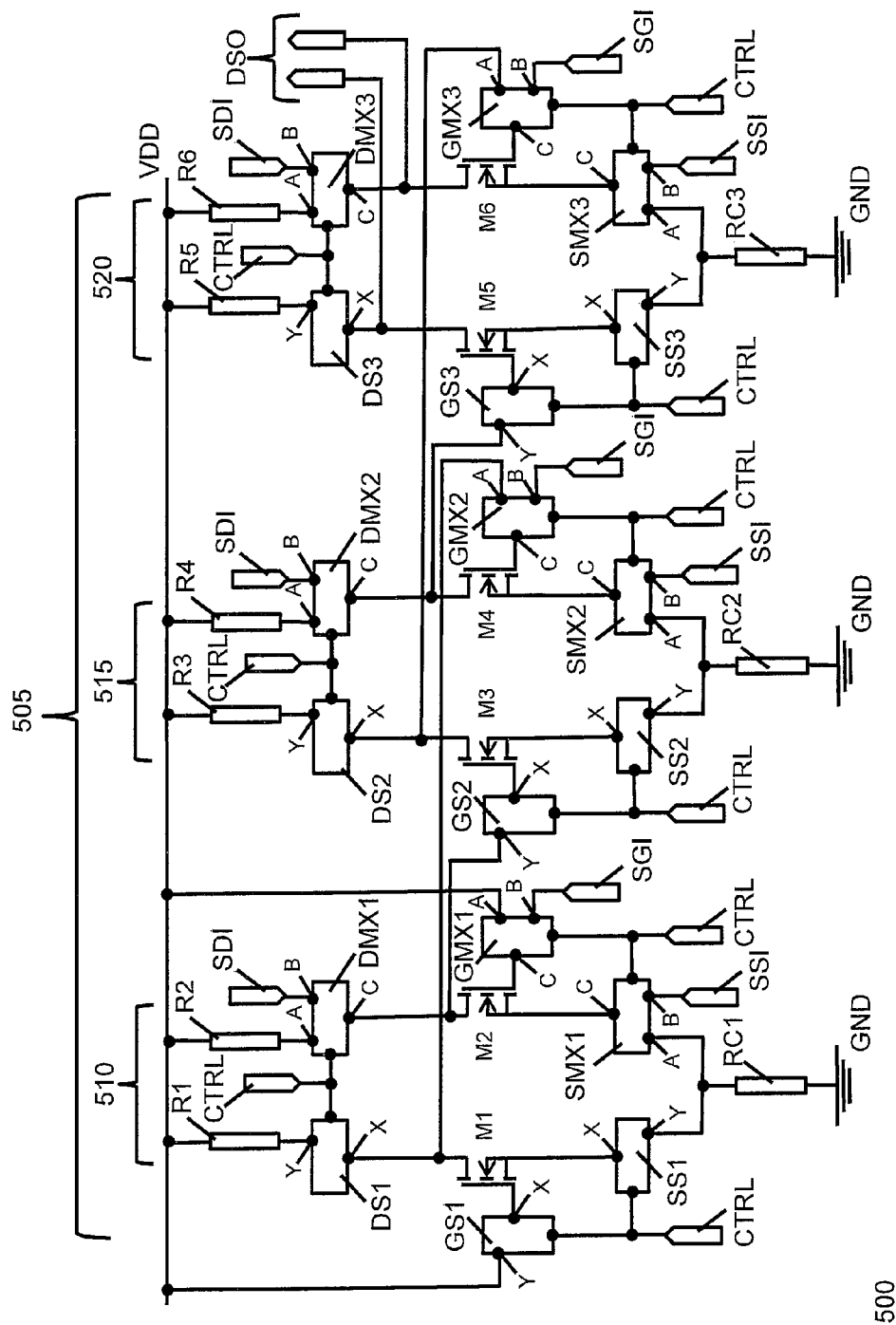
FIG. 5 is a schematic circuit diagram of a configurable amplifier circuit in accordance with a second preferred embodiment of a monitoring circuit forming part of the system of FIG. 1.

FIG. 5 illustrates a circuit diagram of a configurable amplifier circuit 500 according to a second preferred embodiment of the monitoring circuit 130. The configurable amplifier circuit 500 includes a cascaded amplifier circuit 505 comprising a differential amplifier circuit 510, cascaded with a differential amplifier circuit 515 that is cascaded with a differential amplifier circuit 520. The cascaded amplifier circuit 505 has amplifier output terminals in the form of the degradation signal output nodes DSO and in this embodiment the cascaded amplifier circuit 505 is implemented with N-Channel transistors M1 to M6.

The configurable amplifier circuit 500 has a degradation test transistor M2 and resistor R2 coupled to a power supply line VDD to form a first branch of the differential amplifier circuit 510. There is also a reference transistor M1 and resistor R1 coupled to the power supply line VDD that forms a second branch of the differential amplifier circuit 510. Both the first branch and second branch have an associated common resistor RC1 connected to a ground GND terminal. A gate electrode of the reference transistor M1 is selectively coupled to the power supply line VDD via terminals X and Y of a gate switch GS1, whereas a gate electrode of the degradation test transistor M2 is selectively coupled to the supply line via a gate multiplexer GMX1. A source electrode of the reference transistor M1 is selectively coupled to the common resistor RC1 via terminals X and Y of a source switch SS1 and a source electrode of the degradation test transistor M2 is selectively coupled to the common resistor RC1 via a source multiplexer SMX1. Also, a drain electrode of the reference transistor M1 is selectively coupled to the resistor R1 via terminals X and Y of a drain switch DS1 and drain electrode of the degradation test transistor M2 is selectively coupled to the resistor R2 via a drain multiplexer DMX1.

The configurable amplifier circuit 500 also has a degradation test transistor M4 and resistor R4 that is coupled to the power supply line VDD to form a first branch of the differential amplifier circuit 515. There is also a reference transistor M3 and resistor R3 coupled to the power supply line VDD that forms a second branch of the differential amplifier circuit 515. Both the first branch and second branch of the differential amplifier circuit 515 have an associated common resistor RC2 connected to the ground GND terminal. A gate electrode of the reference transistor M3 is selectively coupled to the drain electrode of the degradation test transistor M2 via terminals X and Y of a gate switch GS2, whereas a gate electrode of the degradation test transistor M4 is selectively coupled to the drain electrode of the reference transistor M1 via a gate multiplexer GMX2. A source electrode of the reference transistor M3 is selectively coupled to the common resistor RC2 via terminals X and Y of a source switch SS2 and a source electrode of the degradation test transistor M4 is selectively coupled to the common resistor RC2 via a source multiplexer SMX2. Also, a drain electrode of the reference transistor M3 is selectively coupled to the resistor R3 via terminals X and Y of a drain switch DS2 and drain electrode of the degradation test transistor M4 is selectively coupled to the resistor R4 via a drain multiplexer DMX2.

The configurable amplifier circuit 500 further includes a degradation test transistor M6 and resistor R6 that is coupled to the power supply line VDD to form a first branch of the differential amplifier circuit 520. There is also a reference transistor M5 and resistor R5 coupled to the power supply line VDD that forms a second branch of the differential amplifier circuit 520. Both the first branch and second branch of the differential amplifier circuit 520 have an associated common resistor RC3 connected to the ground GND terminal. A gate electrode of the reference transistor M5 is selectively coupled to the drain electrode of the degradation test transistor M4 via terminals X and Y of a gate switch GS3, whereas a gate electrode of the degradation test transistor M6 is selectively coupled the drain electrode of the reference transistor M3 via a gate multiplexer GMX3. A source electrode of the reference transistor M5 is selectively coupled to the common resistor RC3 via terminals X and Y of a source switch SS3 and a source electrode of the degradation test transistor M6 is selectively coupled to the common resistor RC3 via a source multiplexer SMX3. Also, a drain electrode of the reference transistor M5 is selectively coupled to the resistor R5 via terminals X and Y of a drain switch DS3 and drain electrode of the degradation test transistor M6 is selectively coupled to the resistor R6 via a drain multiplexer DMX3.

The differential amplifier circuit 510 has two output nodes one of which is the drain electrode of the degradation test transistor M2 which is coupled to terminal Y of the gate switch GS2 and the other output node is the drain electrode of the reference transistor M1 which is coupled to an input A of the gate multiplexer GMX2. Similarly, the differential amplifier circuit 515 has two output nodes one of which is the drain electrode of the degradation test transistor M4 which is coupled to terminal Y of the gate switch GS3 and the other output node is the drain electrode of the reference transistor M3 which is coupled to an input A of the gate multiplexer GMX3. Furthermore, the differential amplifier circuit 520 has output nodes providing the degradation signal output nodes DSO that are the drain electrodes of the reference transistor M5 and degradation test transistor M6.

The gate electrode of the degradation test transistor M2 is coupled to an output C of the gate multiplexer GMX1 and an input A of the gate multiplexer GMX1 is coupled to the power supply line VDD. Also, the gate electrodes of the degradation test transistors M4, M6 are respectively coupled to an output C of the gate multiplexers GMX2, GMX3, and inputs B of the gate multiplexers GMX1, GMX2, GMX3 are coupled to input SGI.

The drain electrodes of the degradation test transistors M2, M4, M6 are coupled to a respective output C of the drain multiplexers DMX1, DMX2, DMX3. Resistors R2, R4 and R6 are coupled to respective inputs A of the drain multiplexers DMX1, DMX2, DMX3 and inputs B of the drain multiplexers DMX1, DMX2, DMX3 are coupled to input SDI.

The source electrodes of the degradation test transistors M2, M4, M6 are coupled to a respective output C of the source multiplexers SMX1, SMX2, SMX3. The common resistors RC1, RC2, RC3 are coupled to respective inputs A of the source multiplexers SMX1, SMX2, SMX3 and inputs B of the source multiplexers SMX1, SMX2, SMX3 are coupled to input SSI. In addition, a control input of all the multiplexers SMX1, SMX2, SMX3, DMX1, DMX2, DMX3, GMX1, GMX2, GMX3 are coupled to the control input node CTRL. Also, each of the switches GS1, GS2, GS3, SS1, SS2, SS3, DS1, DS2, DS3 include a transistor having drain and source electrodes providing the terminals X and Y and a gate electrode that is coupled to the control input node CTRL.

Figure 6:
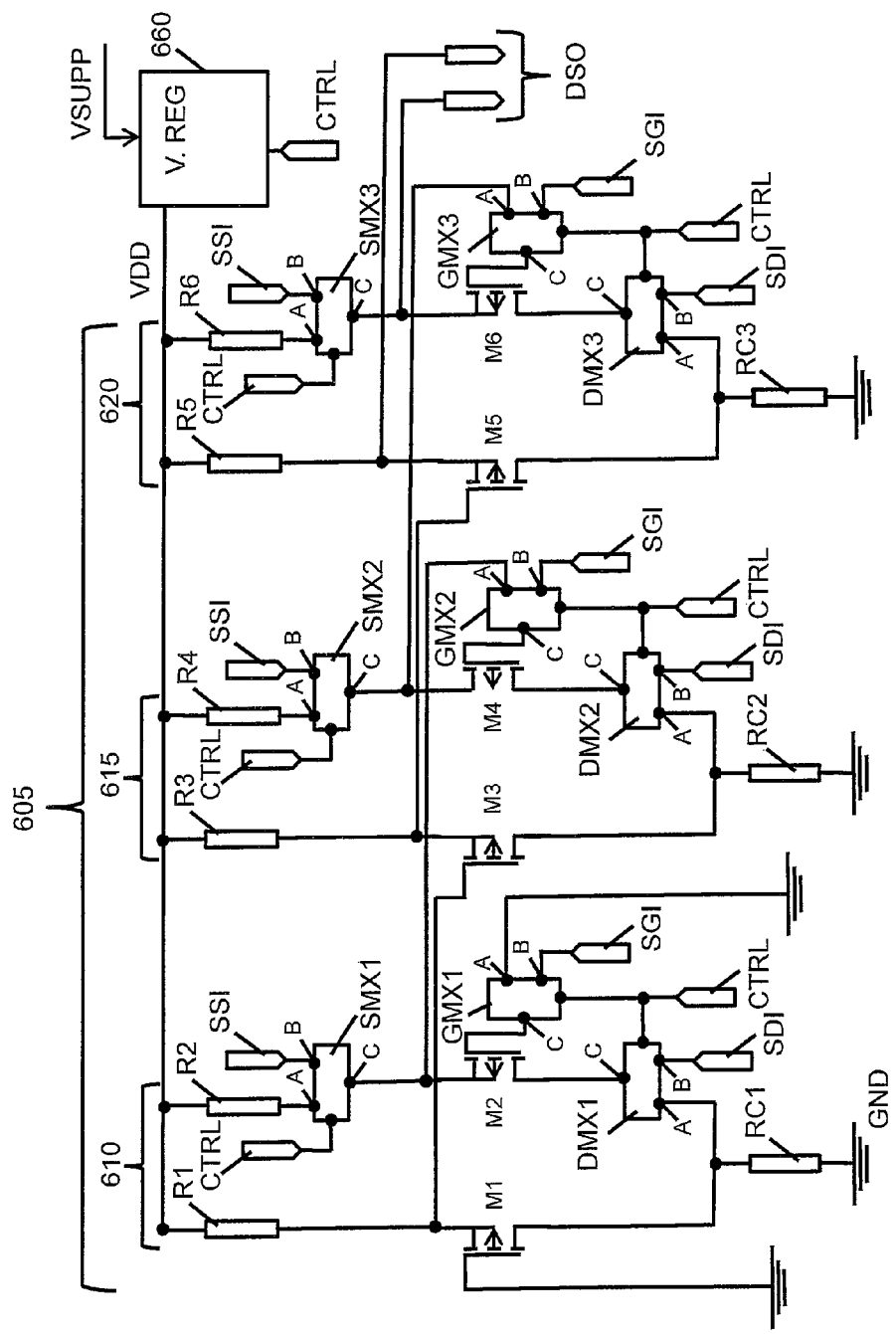
FIG. 6 is a schematic circuit diagram of a configurable amplifier circuit in accordance with a third preferred embodiment of a monitoring circuit forming part of the system of FIG. 1.

Referring to FIG. 6, a circuit diagram of a configurable amplifier circuit 600 according to a third preferred embodiment of the monitoring circuit 130 is illustrated. The configurable amplifier circuit 600 includes a cascaded amplifier circuit 605 comprising a differential amplifier circuit 610, cascaded with a differential amplifier circuit 615 that is cascaded with a differential amplifier circuit 620. The cascaded amplifier circuit 605 has amplifier output terminals in the form of the degradation signal output nodes DSO and in this embodiment the cascaded amplifier circuit 605 is implemented with P-Channel transistors M1 to M6.

The configurable amplifier circuit 600 has a degradation test transistor M2 and resistor R2 coupled to a power supply line VDD to form a first branch of the differential amplifier circuit 610. There is also a reference transistor M1 and resistor R1 coupled to the power supply line VDD that forms a second branch of the differential amplifier circuit 610. Both the first branch and second branch have an associated common resistor RC1 connected to a ground GND terminal. A gate electrode of the reference transistor M1 is coupled to the ground GND terminal, whereas a gate electrode of the degradation test transistor M2 is selectively coupled to the ground GND terminal via a gate multiplexer GMX1. A drain electrode of the reference transistor M1 is coupled to the common resistor RC1 and a drain electrode of the degradation test transistor M2 is selectively coupled to the common resistor RC1 via a drain multiplexer DMX1. Also, a source electrode of the reference transistor M1 is coupled to the resistor R1 and source electrode of the degradation test transistor M2 is selectively coupled to the resistor R2 via a source multiplexer SMX1.

The configurable amplifier circuit 600 also has a degradation test transistor M4 and resistor R4 that is coupled to the power supply line VDD to form a first branch of the differential amplifier circuit 615. There is also a reference transistor M3 and resistor R3 coupled to the power supply line VDD that forms a second branch of the differential amplifier circuit 615. Both the first branch and second branch of the differential amplifier circuit 615 have an associated common resistor RC2 connected to the ground GND terminal. A gate electrode of the reference transistor M3 is coupled to the drain electrode of the reference transistor M1, whereas a gate electrode of the degradation test transistor M4 is selectively coupled to the drain electrode of the degradation test transistor M2 via a gate multiplexer GMX2. A drain electrode of the reference transistor M3 is coupled to the common resistor RC2 and a drain electrode of the degradation test transistor M4 is selectively coupled to the common resistor RC2 via a drain multiplexer DMX2. Also, a source electrode of the reference transistor M3 is coupled to the resistor R3 and source electrode of the degradation test transistor M4 is selectively coupled to the resistor R4 via a source multiplexer SMX2.

The configurable amplifier circuit 600 further includes a degradation test transistor M6 and resistor R6 that is coupled to the power supply line VDD to form a first branch of the differential amplifier circuit 620. There is also a reference transistor M5 and resistor R5 coupled to the power supply line VDD that forms a second branch of the differential amplifier circuit 620. Both the first branch and second branch of the differential amplifier circuit 620 have an associated common resistor RC3 connected to the ground GND terminal. A gate electrode of the reference transistor M5 is coupled to the drain electrode of the reference transistor M3, whereas a gate electrode of the degradation test transistor M6 is selectively coupled the drain electrode of the degradation test transistor M4 via a gate multiplexer GMX3. A drain electrode of the reference transistor M5 is coupled to the common resistor RC3 and a drain electrode of the degradation test transistor M6 is selectively coupled to the common resistor RC3 via a drain multiplexer DMX3. Also, a source electrode of the reference transistor M5 is coupled to the resistor R5 and source electrode of the degradation test transistor M6 is selectively coupled to the resistor R6 via a source multiplexer SMX3.

The differential amplifier circuit 610 has two output nodes one of which is the drain electrode of the degradation test transistor M2 and the other output node is the drain electrode of the reference transistor M1 which are coupled in use to inputs of the differential amplifier circuit 615. Similarly, the differential amplifier circuit 615 has two output nodes one of which is the drain electrode of the degradation test transistor M4 and the other output node is the drain electrode of the reference transistor M3 which are coupled in use to inputs of the differential amplifier circuit 620. Furthermore, the differential amplifier circuit 620 has output nodes providing the degradation signal output nodes DSO that are the drain electrodes of the reference transistor M5 and degradation test transistor M6.

The gate electrode of the degradation test transistor M2 is coupled to an output C of the gate multiplexer GMX1 and an input A of the gate multiplexer GMX1 is coupled to the ground GND terminal. Also, the gate electrodes of the degradation test transistors M4, M6 are respectively coupled to an output C of the gate multiplexers GMX2, GMX3, and inputs B of the gate multiplexers GMX1, GMX2, GMX3 are coupled to input SGI.

The source electrodes of the degradation test transistors M2, M4, M6 are coupled to a respective output C of the source multiplexers SMX1, SMX2, SMX3. Resistors R2, R4 and R6 are coupled to respective inputs A of the source multiplexers SMX1, SMX2, SMX3 and inputs B of the source multiplexers SMX1, SMX2, SMX3 are coupled to input SSI.

The drain electrodes of the degradation test transistors M2, M4, M6 are coupled to a respective output C of the drain multiplexers DMX1, DMX2, DMX3. The common resistors RC1, RC2, RC3 are coupled to respective inputs A of the drain multiplexers DMX1, DMX2, DMX3 and inputs B of the drain multiplexers DMX1, DMX2, DMX3 are coupled to input SDI. In addition, a control input of all the multiplexers SMX1, SMX2, SMX3, DMX1, DMX2, DMX3, GMX1, GMX2, GMX3 are coupled to the control input node CTRL.

The configurable amplifier circuit 600 also includes a voltage regulator 660 with an input power line VSUPP. The voltage regulator 660 has a control input that is coupled to the control input node CTRL and in operation the voltage regulator 660 controls a potential difference across the power supply line VDD and ground GND.

Figure 7:
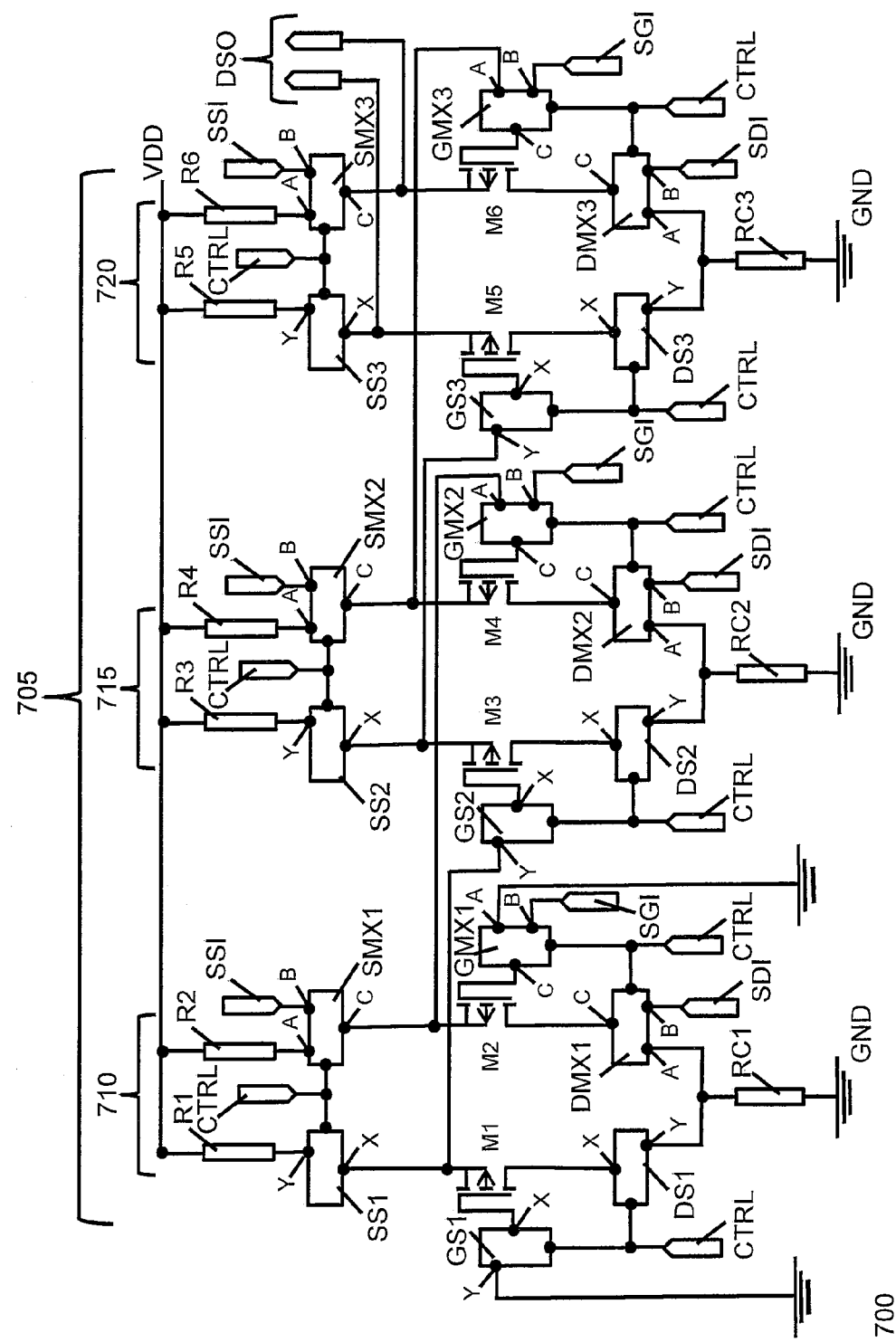
FIG. 7 is a schematic circuit diagram of a configurable amplifier circuit in accordance with a fourth preferred embodiment of a monitoring circuit forming part of the system of FIG. 1.

Referring to FIG. 7, a schematic circuit diagram of a configurable amplifier circuit 700, according to a fourth preferred embodiment of the monitoring circuit 130, is shown. The configurable amplifier circuit 700 includes a cascaded amplifier circuit 705 comprising a differential amplifier circuit 710, cascaded with a differential amplifier circuit 715 that is cascaded with a differential amplifier circuit 720. The cascaded amplifier circuit 705 has amplifier output terminals in the form of the degradation signal output nodes DSO and in this embodiment the cascaded amplifier circuit 605 is implemented with P-Channel transistors M1 to M6.

The configurable amplifier circuit 700 has a degradation test transistor M2 and resistor R2 coupled to a power supply line VDD to form a first branch of the differential amplifier circuit 710. There is also a reference transistor M1 and resistor R1 coupled to the power supply line VDD that forms a second branch of the differential amplifier circuit 710. Both the first branch and second branch have an associated common resistor RC1 connected to a ground GND terminal. A gate electrode of the reference transistor M1 is selectively coupled to the power ground GND terminal via terminals X and Y of a gate switch GS1, whereas a gate electrode of the degradation test transistor M2 is selectively coupled to the ground GND terminal via a gate multiplexer GMX1. A drain electrode of the reference transistor M1 is selectively coupled to the common resistor RC1 via terminals X and Y of a drain switch DS1 and a drain electrode of the degradation test transistor M2 is selectively coupled to the common resistor RC1 via a drain multiplexer DMX1. Also, a source electrode of the reference transistor M1 is selectively coupled to the resistor R1 via terminals X and Y of a source switch SS1 and source electrode of the degradation test transistor M2 is selectively coupled to the resistor R2 via a source multiplexer SMX1.

The configurable amplifier circuit 700 also has a degradation test transistor M4 and resistor R4 that is coupled to the power supply line VDD to form a first branch of the differential amplifier circuit 715. There is also a reference transistor M3 and resistor R3 coupled to the power supply line VDD that forms a second branch of the differential amplifier circuit 715. Both the first branch and second branch of the differential amplifier circuit 715 have an associated common resistor RC2 connected to the ground GND terminal. A gate electrode of the reference transistor M3 is selectively coupled to the source electrode of the reference transistor M1 via terminals X and Y of a gate switch GS2, whereas a gate electrode of the degradation test transistor M4 is selectively coupled to the source electrode of the reference transistor M2 via a gate multiplexer GMX2. A drain electrode of the reference transistor M3 is selectively coupled to the common resistor RC2 via terminals X and Y of a drain switch DS2 and a drain electrode of the degradation test transistor M4 is selectively coupled to the common resistor RC2 via a drain multiplexer DMX2. Also, a source electrode of the reference transistor M3 is selectively coupled to the resistor R3 via terminals X and Y of a source switch SS2 and source electrode of the degradation test transistor M4 is selectively coupled to the resistor R4 via a source multiplexer DMX2.

The configurable amplifier circuit 700 further includes a degradation test transistor M6 and resistor R6 that is coupled to the power supply line VDD to form a first branch of the differential amplifier circuit 720. There is also a reference transistor M5 and resistor R5 coupled to the power supply line VDD that forms a second branch of the differential amplifier circuit 720. Both the first branch and second branch of the differential amplifier circuit 720 have an associated common resistor RC3 connected to the ground GND terminal. A gate electrode of the reference transistor M5 is selectively coupled to the source electrode of the reference transistor M3 via terminals X and Y of a gate switch GS3, whereas a gate electrode of the degradation test transistor M6 is selectively coupled the source electrode of the degradation test transistor M4 via a gate multiplexer GMX3. A drain electrode of the reference transistor M5 is selectively coupled to the common resistor RC3 via terminals X and Y of a drain switch DS3 and a drain electrode of the degradation test transistor M6 is selectively coupled to the common resistor RC3 via a drain multiplexer DMX3. Also, a source electrode of the reference transistor M5 is selectively coupled to the resistor R5 via terminals X and Y of a source switch SS3 and source electrode of the degradation test transistor M6 is selectively coupled to the resistor R6 via a source multiplexer SMX3.

The differential amplifier circuit 710 has two output nodes one of which is the drain electrode of the degradation test transistor M2 and the other output node is the drain electrode of the reference transistor M1 which are coupled in use to inputs of the differential amplifier circuit 715. Similarly, the differential amplifier circuit 715 has two output nodes one of which is the drain electrode of the degradation test transistor M4 and the other output node is the drain electrode of the reference transistor M3 which are coupled in use to inputs of the differential amplifier circuit 720. Furthermore, the differential amplifier circuit 720 has output nodes providing the degradation signal output nodes DSO that are the drain electrodes of the reference transistor M5 and degradation test transistor M6.

The gate electrode of the degradation test transistor M2 is coupled to an output C of the gate multiplexer GMX1 and an input A of the gate multiplexer GMX1 is coupled to the ground GND terminal. Also, the gate electrodes of the degradation test transistors M4, M6 are respectively coupled to an output C of the gate multiplexers GMX2, GMX3, and inputs B of the gate multiplexers GMX1, GMX2, GMX3 are coupled to input SGI.

The source electrodes of the degradation test transistors M2, M4, M6 are coupled to a respective output C of the source multiplexers SMX1, SMX2, SMX3. Resistors R2, R4 and R6 are coupled to respective inputs A of the source multiplexers SMX1, SMX2, SMX3 and inputs B of the source multiplexers SMX1, SMX2, SMX3 are coupled to input SSI.

The drain electrodes of the degradation test transistors M2, M4, M6 are coupled to a respective output C of the drain multiplexers DMX1, DMX2, DMX3. The common resistors RC1, RC2, RC3 are coupled to respective inputs A of the drain multiplexers DMX1, DMX2, DMX3 and inputs B of the drain multiplexers DMX1, DMX2, DMX3 are coupled to input SDI. In addition, a control input of all the multiplexers SMX1, SMX2, SMX3, DMX1, DMX2, DMX3, GMX1, GMX2, GMX3 are coupled to the control input node CTRL. Also, each of the switches GS1, GS2, GS3, SS1, SS2, SS3, DS1, DS2, DS3 include a transistor having drain and source electrodes providing the terminals X and Y and a gate electrode that is coupled to the control input node CTRL.

For each of the above embodiments, it will be clear that the present invention has plurality of multiplexers SMX1, SMX2, SMX3, DMX1, DMX2, DMX3, GMX1, GMX2, GMX3 each having an output coupled to a respective electrode of the degradation test transistor or transistors M2, M4, M6. Each of the multiplexers SMX1, SMX2, SMX3, DMX1, DMX2, DMX3, GMX1, GMX2, GMX3 also has an input B coupled to one of the monitor nodes N1, N2, N3 and an input A coupled to a respective node of the amplifier circuit 205, 505, 605 or 705.

In all of the above embodiments of the configurable amplifier circuits 200, 500, 600 and 700 the multiplexers SMX1, SMX2, SMX3, DMX1, DMX2, DMX3, GMX1, GMX2, GMX3 are implemented with the multiplexer 400. Furthermore, in these embodiments at least the primary semiconductor circuit 110 and at least part of the amplifier circuits, specifically the transistors M2, M4, M6, are formed on a single semiconductor substrate.

In operation, the multiplexers SMX1, SMX2, SMX3, DMX1, DMX2, DMX3, GMX1, GMX2, GMX3 selectively insert the degradation test transistor or transistors M2, M4, M6 into either the primary semiconductor circuit 110 or the amplifier circuit 205, 505, 605 or 705. In this regard, the processor 140 provides control signals at the control signal output node CTRLOUT to the control input node CTRL of the monitoring circuit 130. The control signals thereby control when the degradation test transistors M2, M4, M6 are inserted into the primary semiconductor circuit. When inserted into the primary semiconductor circuit 110, the degradation test transistor or transistors M2, M4, M6 are subjected to stress degradation voltages in the primary semiconductor circuit 110. When inserted into the amplifier circuit 205, 505, 605 or 705, an output signal at the output terminal DSO is indicative of stress degradation of the degradation test transistor or transistors M2, M4, M6. Consequently, since the transistor T1 of the primary semiconductor circuit 110 has also been subjected to the same stress degradation voltages as those of the degradation test transistors M2, M4, M6, then the output signal at the output terminal DSO is also indicative of stress degradation of the transistor T1. The output signal at the output terminal DSO is therefore be used as an indicator of stress degradation of the primary semiconductor circuit 110.

With reference to the amplifiers circuits 200 and 600, when the multiplexers connect the respective electrodes of the degradation test transistors M2, M4, M6 to the nodes of the primary semiconductor circuit 110 via the buffer module 120, the voltage regulator 260 or 660 reduces the voltage at VDD so that the reference transistors M1, M3, M5 are not subjected to stress. Thus, in operation, the supply voltage across each reference transistor M1, M3, M5 is reduced when the degradation test transistors M2, M4, M6 are inserted into the primary semiconductor circuit 110.

In contrast, referring to the amplifiers circuits 500 and 700, when the multiplexers connect the respective electrodes of the degradation test transistors M2, M4, M6 to the nodes of the primary semiconductor circuit 110, the switches GS1, GS2, GS3, SS1, SS2, SS3, DS1, DS2, DS3 disconnect (isolate) the transistors M2, M4, M6 from VDD and Ground GND so that they are not subjected to stress. Thus, in operation, the switches selectively isolate each reference transistor M1, M3, M5 from the amplifier circuit when the degradation test transistors M2, M4, M6 are inserted into the primary semiconductor circuit 110.

Figure 8:
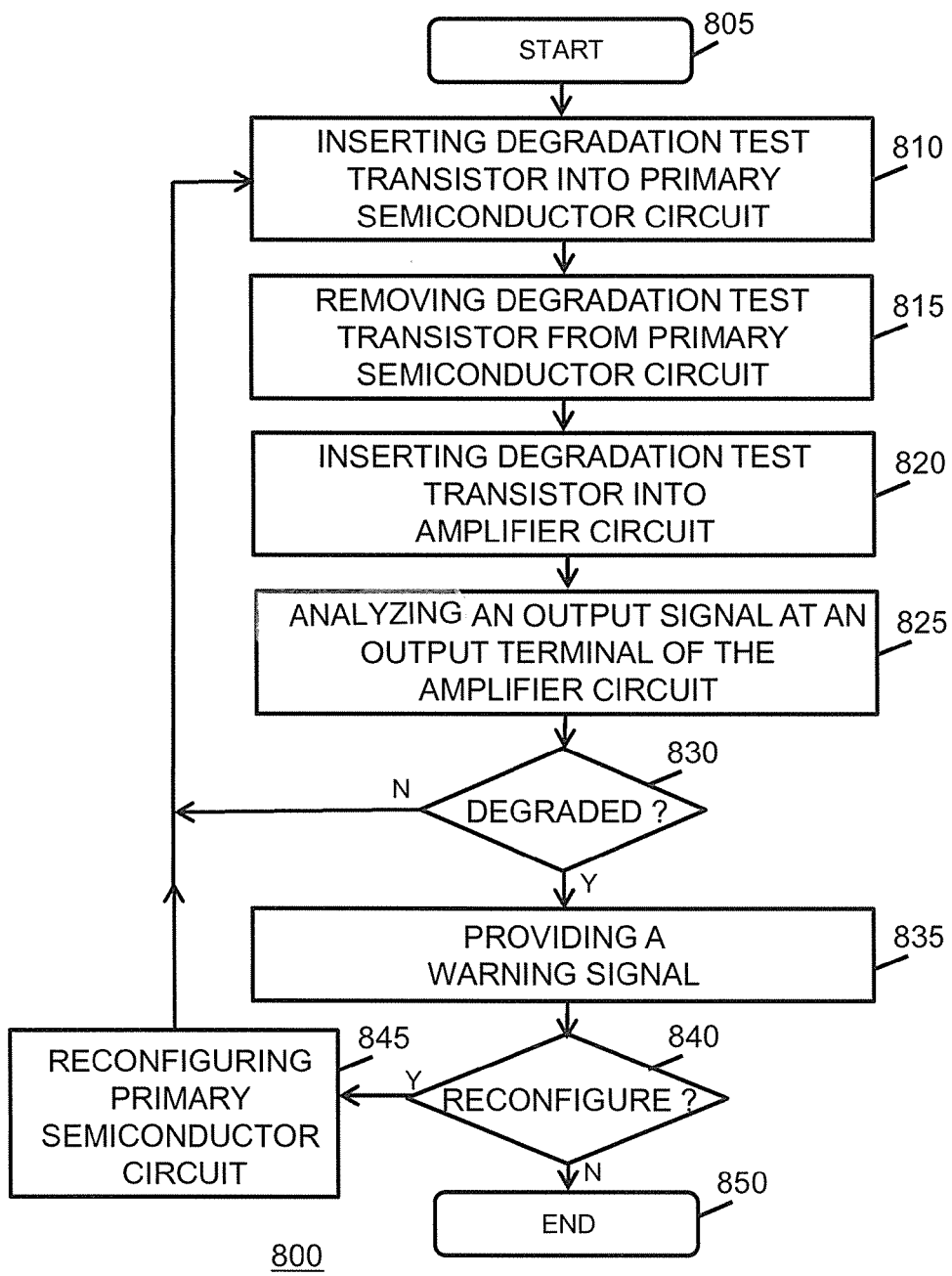
FIG. 8 is a flow chart illustrating a method for monitoring stress degradation of a semiconductor circuit in accordance with a preferred embodiment of the present invention.

Referring to FIG. 8, a flow chart illustrating a method 800 for monitoring stress degradation of the semiconductor circuit 110, in accordance with a preferred embodiment of the present invention, is shown. In this embodiment the method 800 is controlled by the processor 140 and by way of example only the method will be described with reference to the configurable amplifier circuit 200. The method 800 starts after the system 100 powers up at a start block 805. The method 800 includes, at a block 810, inserting the degradation test transistors M2, M4, M6 into the primary semiconductor circuit 110. This thereby subjects the degradation test transistors M2, M4, M6 to stress degradation voltages when the transistor T1 is subjected to such voltages. At a block 815 there is performed the removing the degradation test transistors M", M4, M6 from the primary semiconductor circuit 110 and at an inserting block 820 the degradation test transistors M2, M4, M6 are inserted into the amplifier circuit 200.

At a block 825, the processor 140, at an analyzing block 825, performs analyzing the output signal at the output terminal of the amplifier circuit (the degradation signal output node or nodes DSO) to determine if the degradation test transistors M2, M4, M6 are degraded. The output signal is received by the processor at the degradation signal input node or nodes DSI and at a test block 830 the processor determines if the degradation test transistors M2, M4, M6 are degraded. If the test block determines that the degradation test transistors M2, M4, M6 are not degraded then the method returns to block 810. Alternatively, if the test block determines that the degradation test transistors M2, M4, M6 are degraded the method 900 goes to a block 835 and provides a warning signal indicative of the primary semiconductor circuit 110 being degraded. This warning signal is in response to the analyzing block 825 determining that the degradation test transistors M2, M4, M6 are degraded.

The processor 140 then checks a FLAG, at a test block 840, to check if the primary semiconductor circuit 110 has been previously reconfigured. If there has been a previous reconfiguring the method 800 terminates at an end block 850 and powers down the primary semiconductor circuit 110 (removes the power supply VDD), and the system 100 optionally provides a fault signal indicating that the primary semiconductor circuit 110 is degraded and cannot be used. Alternatively, if there has been no previous reconfiguring the method 800, at a block 845, performs reconfiguring of the primary semiconductor circuit 110. This reconfiguring can be simply switching out transistor T1 and switching in another transistor. This switching in and out of components is known in the art and similarly since degradation test transistors M2, M4, M6 are degraded the monitoring circuit 130 is also reconfigured. The method 800 then returns to block 810 and the method 800 wait for a pre-defined time before repeating the appropriate blocks 810 to 840.

Advantageously, the present invention provides for detecting a stressed or degraded circuit so that the accuracy and performance of a system is not compromised once the stress or degradation has been detected. Once detected, reconfiguration or power down can occur and the stress insertion of the stress detection transistors M2, M4, M6 may be performed as frequently as deemed necessary and may be dependent on the specific application of the primary semiconductor circuit 110.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. For instance, although a cascaded differential amplifier has been used in the embodiments, a single stage conventional amplifier, with a single output terminal (referenced to ground), may be appropriate for some applications. It is understood, therefore, that this invention is not limited to the particular embodiment disclosed, but covers modifications within the spirit and scope of the present invention as defined by the appended claims.

The invention claimed is:

1. A system for detecting stress degradation of a semiconductor circuit, the system comprising:
   a primary semiconductor circuit that has a plurality of monitor nodes;
   an amplifier circuit with at least one amplifier output terminal;
   at least one degradation test transistor; and
   a plurality of multiplexers each having an output coupled to a respective electrode of the degradation test transistor, and each of the multiplexers having an input coupled to one of the monitor nodes and a respective node of the amplifier circuit,
   wherein in operation the multiplexers selectively insert the degradation test transistor into either the primary semiconductor circuit or the amplifier circuit so that when inserted into the primary semiconductor circuit the degradation test transistor is subjected to stress degradation voltages in the primary semiconductor circuit and wherein when inserted into the amplifier circuit an output signal at the output terminal is indicative of stress degradation of the primary semiconductor circuit,
   wherein the amplifier circuit includes a differential amplifier and the degradation test transistor forms part of a first branch of the differential amplifier and part of a second branch of the differential amplifier is formed by a reference transistor.

2. The system for detecting stress degradation of claim 1, wherein the differential amplifier is one of a plurality of cascaded differential amplifiers, each of the differential amplifiers including a said degradation test transistor and a said reference transistor.

3. The system for detecting stress degradation of claim 2, wherein there are a plurality of switches that in operation selectively isolate each said reference transistor from the amplifier circuit when said degradation test transistor is inserted into the primary semiconductor circuit.

4. The system for detecting stress degradation of claim 2, wherein in operation the supply voltage across each said reference transistor is reduced when said degradation test transistor is inserted into the primary semiconductor circuit.

5. The system for detecting stress degradation of claim 2, wherein the least one amplifier output terminal includes differential output nodes of the cascaded differential amplifiers.

6. The system for detecting stress degradation of claim 1, further including a processor for providing control signals for controlling when said degradation test transistor is inserted into the primary semiconductor circuit.

7. The system for detecting stress degradation of claim 6, wherein an input of the processor is coupled to the output terminal.

8. The system for detecting stress degradation of claim 1, wherein the primary semiconductor circuit and at least part of the amplifier circuit are formed on a single semiconductor substrate.

9. The system for detecting stress degradation of claim 1, wherein the monitor nodes are gate, drain and source electrodes of a transistor.

10. The system for detecting stress degradation of claim 1, wherein the monitor nodes are coupled to the amplifier circuit via unity gain buffers.

11. A method for monitoring stress degradation of a semiconductor circuit, the method being controlled by a processor, the method comprising:
    inserting at least one degradation test transistor into a primary semiconductor circuit to thereby subject the degradation test transistor to stress degradation voltages;
    removing the degradation test transistor from the primary semiconductor circuit;
    inserting the degradation test transistor into an amplifier circuit;
    analyzing an output signal at an output terminal of the amplifier circuit to determine if the degradation test transistor is degraded;
    providing a warning signal indicative of the primary semiconductor circuit being degraded in response to the analyzing determining that the degradation test transistor is degraded; and
    reconfiguring the primary semiconductor circuit when the warning signal is provided.

12. A method for monitoring stress degradation of claim 11, further including removing a power supply from the primary semiconductor circuit when the warning signal is provided.

13. The method for monitoring stress degradation of claim 11, wherein the amplifier circuit includes a differential amplifier circuit.

14. The method for monitoring stress degradation of claim 13, further comprising a reference transistor, wherein the degradation test transistor forms a first branch of the differential amplifier and the reference transistor forms a second branch of the differential amplifier.

15. The method for monitoring stress degradation of claim 14, wherein a supply voltage across said reference transistor is reduced when said degradation test transistor is inserted into the primary semiconductor circuit.

16. The method for monitoring stress degradation of claim 14, wherein there are a plurality of switches that in operation selectively isolate the reference transistor from the amplifier circuit when the degradation test transistor is inserted into the primary semiconductor circuit.

* * * * *